(12) United States Patent
Zheng et al.

(10) Patent No.: US 10,418,337 B2
(45) Date of Patent: Sep. 17, 2019

(54) INDUCTOR STRUCTURE MOUNTED ON PCB BOARD AND VOLTAGE REGULATOR MODULE HAVING THE SAME

(71) Applicant: Delta Electronics (Shanghai) Co., Ltd., Shanghai (CN)

(72) Inventors: Xiangxing Zheng, Shanghai (CN); Wenhua Li, Shanghai (CN); Quansong Luo, Shanghai (CN); Yuanyuan Dan, Shanghai (CN); Haijun Yang, Shanghai (CN); Shaohua Zhu, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/909,954

(22) Filed: Mar. 1, 2018

(65) Prior Publication Data
US 2018/0374802 A1 Dec. 27, 2018

(30) Foreign Application Priority Data
Jun. 21, 2017 (CN) .................... 2017 2 0725187 U

(51) Int. Cl.
*H01L 23/64* (2006.01)
*H05K 1/02* (2006.01)
(Continued)

(52) U.S. Cl.
CPC ....... *H01L 23/645* (2013.01); *H01F 27/2804* (2013.01); *H01F 27/306* (2013.01);
(Continued)

(58) Field of Classification Search
CPC ... H01L 23/645; H01L 28/10; H01L 27/0288; H01L 2924/1206; H01L 2924/19042;
(Continued)

(56) References Cited

U.S. PATENT DOCUMENTS

| 2011/0080283 | A1* | 4/2011 | Schweitzer, III | G01R 31/085 |
| | | | | 340/539.26 |
| 2012/0049994 | A1* | 3/2012 | Joo | H01F 17/04 |
| | | | | 336/233 |

(Continued)

FOREIGN PATENT DOCUMENTS

| CN | 1747083 A | 3/2006 |
| CN | 101431868 A | 5/2009 |
| CN | 101631433 A | 1/2010 |

*Primary Examiner* — Shahed Ahmed
(74) *Attorney, Agent, or Firm* — CKC & Partners Co., LLC

(57) ABSTRACT

The present disclosure discloses an inductor structure mounted on a PCB board and a voltage regulator module having the same. The inductor structure includes inductor cores and inductor windings. The PCB board is provided with at least one hollow part, and the hollow part comprises a plurality of through holes spaced apart. The legs of the inductor cores are correspondingly inserted into the through holes at the corresponding positions of the hollow part, wherein any two adjacent through holes of the plurality of through holes have a spacer therebetween for use as the inductor winding of the inductor structure, and the thickness of the spacer is less than the thickness of the PCB board.

12 Claims, 2 Drawing Sheets

(51) Int. Cl.
  *H01L 49/02* (2006.01)
  *H05K 1/16* (2006.01)
  *H01F 27/28* (2006.01)
  *H01F 27/30* (2006.01)
  *H01F 37/00* (2006.01)
  *H01F 27/24* (2006.01)

(52) U.S. Cl.
  CPC ............. *H01F 37/00* (2013.01); *H01L 28/10* (2013.01); *H05K 1/0243* (2013.01); *H05K 1/0262* (2013.01); *H05K 1/0263* (2013.01); *H05K 1/165* (2013.01); *H01F 27/24* (2013.01); *H01F 27/28* (2013.01); *H05K 2201/086* (2013.01); *H05K 2201/09036* (2013.01); *H05K 2201/1028* (2013.01)

(58) Field of Classification Search
  CPC .... H05K 1/0243; H05K 1/0262; H05K 1/165; H01F 27/24; H01F 27/28; H01F 27/00–427; H01F 17/0006–17/0033; H01F 2017/004–0086
  See application file for complete search history.

(56) References Cited

U.S. PATENT DOCUMENTS

| | | | |
|---|---|---|---|
| 2012/0062798 A1* | 3/2012 | Deleu | H03H 7/09 348/607 |
| 2013/0207731 A1* | 8/2013 | Balteanu | H03F 1/02 330/296 |

* cited by examiner

INDUCTOR STRUCTURE MOUNTED ON PCB BOARD AND VOLTAGE REGULATOR MODULE HAVING THE SAME

CROSS-REFERENCE TO RELATED APPLICATIONS

This non-provisional application claims priority under 35 U.S.C. § 119(a) on Patent Application No. 201720725187.0 filed in P.R. China on Jun. 21, 2017, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

TECHNICAL FIELD

The present disclosure is related to an inductor structure mounted on a PCB board and a voltage regulator module having the same.

BACKGROUND

A voltage regulator module provides a stable operating voltage for CPU mainly through the conversion of DC-to-DC voltage, wherein the input voltage is generally 12V DC voltage, the output voltage is generally a low-voltage and the output current is high (the output voltage is generally about 1.8V, and the current is generally not below 100 A). In addition, the voltage regulator module is generally required to have high efficiency, a high power density, a small size, a low height and so on.

In order to achieve high efficiency, a high power density, a small size and a low height, the first method known to the inventors is to realize a voltage regulator module by using a multiphase interleaved buck circuit which is generally designed to have a high frequency, thereby greatly reducing the size and height of a magnetic component. The second method known to the inventors is to replace the traditional discrete MOSFET components to Driver+MOSFET integrated components in a voltage regulator module. The third method known to the inventors is to realize a voltage regulator module by using the technology of magnetic integration.

The voltage regulator module is not only required to have a small size but also required to have a low height. In general, in a voltage regulator module, the height of an inductor is far higher than the height of a common semiconductor component whose height is usually about 1 mm. In order to reduce the height of the whole product, how to reduce the height of the inductor has become a problem that must be considered during design.

Referring to FIG. 1, FIG. 1 is a side view of an inductor structure as conventionally known in the art. As shown in FIG. 1, the inductor structure includes a PCB board 11 and a magnetic core 12. The PCB board 11 is provided with a plurality of through holes spaced apart, and the magnetic core 12 is inserted into the plurality of through holes, the copper foil in the PCB board is used as the coil of the inductor structure, the overall height of the product is generally lower than that of a product using a conventional discrete inductor. However, the thickness of the coil thereof is the thickness of the whole PCB board, and the multi-layer PCB board is relatively thick, e.g., an 8-layer PCB board generally has a thickness of about 2 mm. In this way, the overall height Hd1 of the PCB inductor structure is about 6.3 mm, which cannot meet the height requirements yet in some cases. Therefore, it is imperative to develop an inductor structure that can overcome the above drawbacks.

SUMMARY

According to one embodiment of the present disclosure, an inductor structure mounted on a PCB board is provided, the inductor structure comprises inductor cores and inductor windings, the PCB board is provided with at least one hollow part, each said hollow part comprises a plurality of through holes spaced apart, the legs of the inductor cores are correspondingly inserted into the through holes at the corresponding positions of the hollow part, wherein any two adjacent through holes of the plurality of through holes have a spacer therebetween for use as the inductor winding of the inductor structure, and the thickness of the spacer is less than the thickness of the PCB board.

The present disclosure further provides a voltage regulator module, the voltage regulator module comprises a multiphase interleaved buck circuit, each phase of the multiphase interleaved buck circuit comprises an inductor structure as described above.

According to another embodiment of this present disclosure, an inductor structure mounted on a PCB board is provided, the inductor structure comprises an inductor core and an inductor winding, the PCB board is provided with at least one hollow part, wherein the inductor structure further comprises a plurality of copper strips used as the inductor windings of the inductor structure, the copper strips are spaced apart in the hollow part so as to form a plurality of through holes, and the leg of the inductor core is correspondingly inserted into the through hole at the corresponding position of the hollow part.

The present disclosure still further provides a voltage regulator module, the voltage regulator module comprises a multiphase interleaved buck circuit, each phase of the multiphase interleaved buck circuit comprises the above-mentioned inductor structure.

DETAILED DESCRIPTION

Hereinafter the present disclosure will be described in detail with reference to the Figures and examples: The examples were carried out on the premise of the technical solution of the present disclosure, and the operation modes and processes are given, but the protection scope of the present disclosure is not limited to the following examples.

Figure 2:
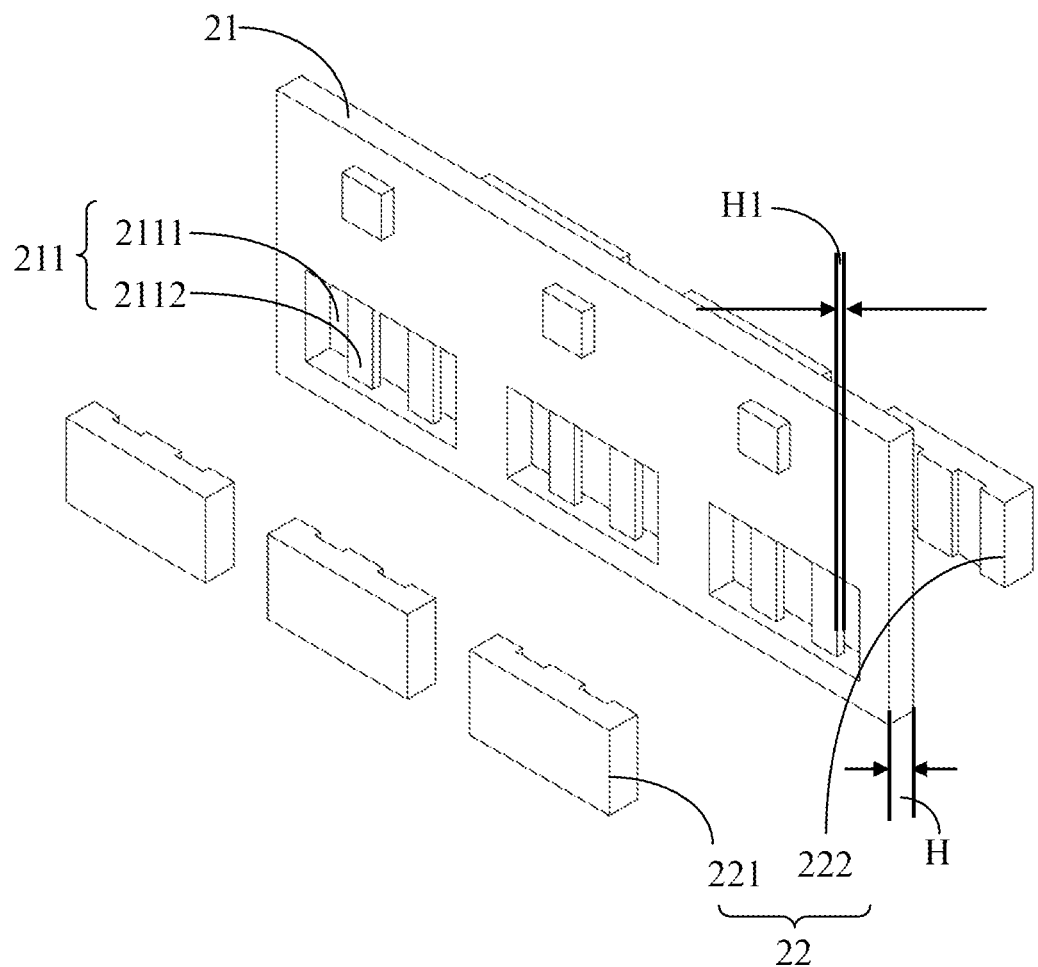
FIG. 2 is an exploded view of an inductor structure according to an embodiment of the present disclosure.
Figure 3:
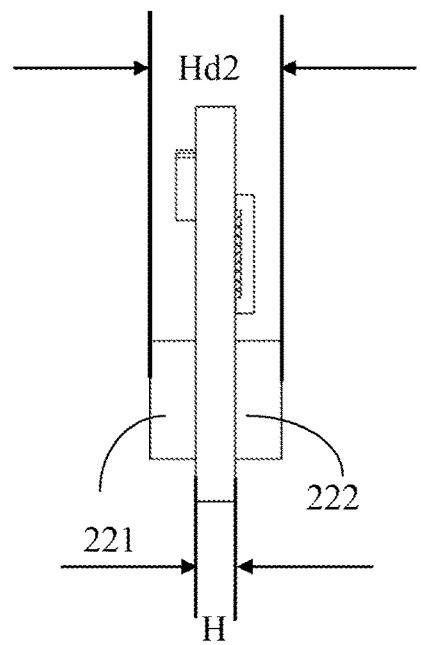
FIG. 3 is a side view of the inductor structure of FIG. 2 after assembly.

Referring to FIG. 2 and FIG. 3, FIG. 2 is an exploded view of an inductor structure according to an embodiment of the present disclosure, and FIG. 3 is a side view of the inductor structure of FIG. 2 after assembly. As shown in FIG. 2 and FIG. 3, the inductor structure mounted on a PCB board comprises inductor core 22 and inductor windings. The PCB board 21 is provided with at least one hollow part 211, and the hollow part 211 comprises a plurality of through holes 2111 spaced apart, and the legs of the inductor core 22 are correspondingly inserted into the through holes 2111 at the corresponding positions of the hollow part 211, and any two adjacent through holes 2111 of the plurality of through holes 2111 have a spacer 2112 therebetween for use as the inductor winding of the inductor structure. The thickness H1 of the spacer 2112 is less than the thickness H of the PCB board 21.

Further, the PCB board 21 comprises a bottom layer, a top layer, and a plurality of intermediate layers located between the bottom layer and the top layer. The spacer 2112 is composed of at least a part of the plurality of intermediate layers, and is used as the winding of the inductor structure, thereby reducing the overall height of the inductor structure. For example, the inductor core 22 is of EE type which includes an upper core 221 and/or a lower core 222, wherein a part of the upper core 221 and/or a part of the lower core 222 are/is embedded in the PCB board 21 after assembly, thereby reducing the overall height of the inductor structure. However, the present disclosure does not limit the structure of the magnetic core 22. In other embodiments, the inductor core 22 may also be of one of EI type, EQ type, ER type, PQ type, UU type, and CC type.

Figure 1:
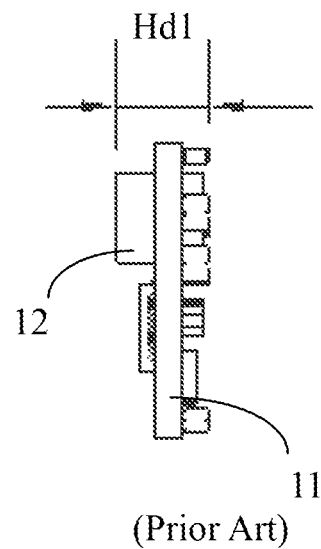
FIG. 1 is a side view of an inductor structure in the art.

Taking an 8-layer PCB board as an example, the thickness of the PCB board 21 is generally about 2 mm, and the total height Hd2 of the inductor structure is about 4.7 mm, which is remarkably lower than the inductor structure's total height Hd1 of about 6.3 mm in FIG. 1.

In an embodiment of the present disclosure, the spacer 2112 is composed of the bottom layer and at least a part of the plurality of intermediate layers.

In another embodiment of the present disclosure, the spacer 2112 is composed of the top layer and at least a part of the plurality of intermediate layers.

It can be known that the spacers 2112 of the plurality of hollow parts 211 have the same structure in the foregoing embodiments, but the present disclosure is not limited thereto. In other embodiments of the present disclosure, on a PCB board 21, at least a part of the spacers 2112 of the plurality of hollow parts 211 are different.

The present disclosure further provides a voltage regulator module, which comprises a multiphase interleaved buck circuit. Each phase of the multiphase interleaved buck circuit comprises the inductor structure as described above.

Figure 4:
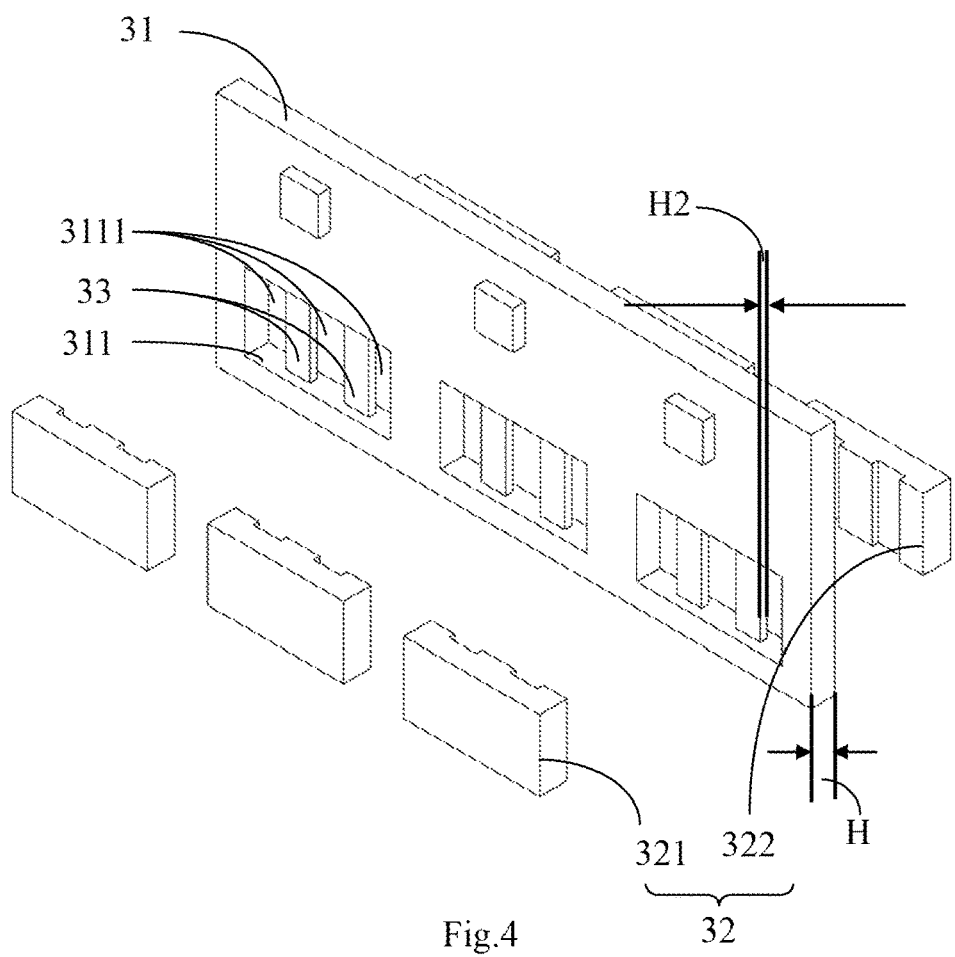
FIG. 4 is an exploded view of an inductor structure according to another embodiment of the present disclosure.

Referring to FIG. 4, FIG. 4 is an exploded view of an inductor structure according to another embodiment of the present disclosure. As shown in FIG. 4, the inductor structure mounted on a PCB board comprises an inductor core 32 and an inductor winding. The PCB board 31 is provided with at least one hollow part 311. The inductor structure further comprises a plurality of copper strips 33 which are used as the inductor windings of the inductor structure. The copper strips 33 are spaced apart in the hollow part 311 so as to form a plurality of through holes 3111, and the leg of the inductor core 32 is correspondingly inserted into the through hole 3111 at the corresponding position of the hollow part 311. The overall height of the inductor structure is reduced by using the copper strips 33 as the inductor windings of the inductor structure.

For example, the inductor core 32 is of EE type which includes an upper core 321 and/or a lower core 322, wherein a part of the upper core 321 and/or a part of the lower core 322 are/is embedded in the PCB board 31 after assembly, thereby reducing the overall height of the inductor structure. But, the present disclosure does not limit the structure of the magnetic core. In other embodiments, the inductor core 32 may also be of one of EI type, EQ type, ER type, PQ type, UU type, and CC type.

Further, the thickness H2 of the copper strip 33 is less than the thickness H of the PCB board 31. Moreover, for example, the thickness H2 of the copper strip 33 is 0.5 mm. But the present disclosure is not limited thereto.

The present disclosure further provides a voltage regulator module, which comprises a multiphase interleaved buck circuit, each phase of the multiphase interleaved buck circuit comprises an inductor structure as shown in FIG. 4.

In summary, the PCB inductor structure of the present disclosure reduces the overall height of the inductor structure by thinning the spacers which use a part of the multiple layers of the PCB board as the inductor windings of the inductor structure, or by adding the copper strips as the inductor windings of the inductor structure, wherein the thickness of the copper strips is less than the thickness of the PCB board, thereby better meeting the design requirement that the product is thin. Since an insulation layer is disposed between any adjacent layers of the PCB board, when a part of the plurality of layers of the PCB board are used as the inductor winding, the insulation layers will lower the efficiency of the inductor. In this regard, the copper strips are used as the inductor windings of the inductor structure, making the inductor have a lower DC resistance, thereby enhancing the efficiency of the inductor.

It should be noted that the above embodiments are only illustrative of the present disclosure and are not intended to limit the technical solution described in the present disclosure; besides, although in the present specification the present disclosure has been described in detail with reference to the foregoing embodiments, those skilled in the art should appreciate that the present disclosure still can be modified or replaced by an equivalent; therefore, all technical solutions and improvements that do not depart from the spirit and scope of the present disclosure should be covered by the protection scope of the claims appended to the present disclosure.

What is claimed is:

1. An inductor structure mounted on a PCB board, comprising:
   inductor cores and inductor windings, wherein the PCB board is provided with at least one hollow part, each said hollow part comprises a plurality of through holes spaced apart, the legs of the inductor cores are correspondingly inserted into the through holes at the corresponding positions of the hollow part, wherein any two adjacent through holes of the plurality of through holes have a spacer therebetween for use as the inductor winding of the inductor structure, and the thickness of the spacer is less than the thickness of the PCB board.

2. The inductor structure of claim 1, wherein the PCB board comprises a bottom layer, a top layer, and a plurality of intermediate layers between the bottom layer and the top layer.

3. The inductor structure of claim 2, wherein the spacer is composed of the bottom layer and at least one part of the plurality of intermediate layers.

4. The inductor structure of claim 2, wherein the spacer is composed of the top layer and at least one part of the plurality of intermediate layers.

5. The inductor structure of claim 2, wherein the spacer is composed of at least one part of the plurality of intermediate layers.

6. The inductor structure of claim 1, wherein the inductor core is EE type, EI type, EQ type, ER type, PQ type, UU type or CC type.

7. A voltage regulator module, comprising a multiphase interleaved buck circuit, wherein each phase of the multiphase interleaved buck circuit comprises an inductor structure according to claim 1.

8. The voltage regulator module of claim 7, wherein the PCB board comprises a bottom layer, a top layer, and a plurality of intermediate layers between the bottom layer and the top layer.

9. The voltage regulator module of claim 8, wherein the spacer is composed of the bottom layer and at least one part of the plurality of intermediate layers.

10. The voltage regulator module of claim 8, wherein the spacer is composed of the top layer and at least one part of the plurality of intermediate layers.

11. The voltage regulator module of claim 8, wherein the spacer is composed of at least one part of the plurality of intermediate layers.

12. The voltage regulator module of claim 7, wherein the inductor core is EE type, EI type, EQ type, ER type, PQ type, UU type or CC type.

* * * * *